United States Patent
Kim et al.

(10) Patent No.: US 10,504,994 B2
(45) Date of Patent: Dec. 10, 2019

(54) POWER SEMICONDUCTOR DEVICE AND FABRICATION METHOD THEREOF

(71) Applicant: MagnaChip Semiconductor, Ltd., Cheongju-si (KR)

(72) Inventors: Ho Hyun Kim, Seoul (KR); Seung Bae Hur, Incheon (KR); Seung Wook Song, Daegu (KR); Jeong Hwan Park, Gumi-si (KR); Ha Yong Yang, Cheongju-si (KR); In Su Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/806,225

(22) Filed: Jul. 22, 2015

(65) Prior Publication Data

US 2015/0325653 A1    Nov. 12, 2015

Related U.S. Application Data

(62) Division of application No. 13/915,810, filed on Jun. 12, 2013, now Pat. No. 9,123,769.

(30) Foreign Application Priority Data

Sep. 13, 2012    (KR) .................. 10-2012-0101712

(51) Int. Cl.
*H01L 29/739*    (2006.01)
*H01L 29/66*    (2006.01)
(Continued)

(52) U.S. Cl.
CPC ...... *H01L 29/1095* (2013.01); *H01L 29/0804* (2013.01); *H01L 29/0821* (2013.01);
(Continued)

(58) Field of Classification Search
CPC ............. H01L 29/0696; H01L 29/1095; H01L 29/66325; H01L 29/7393; H01L 29/7395;
(Continued)

(56) References Cited

U.S. PATENT DOCUMENTS 6,153,495 A    11/2000    Kub et al.
6,162,665 A    12/2000    Zommer
(Continued)

FOREIGN PATENT DOCUMENTS

| CN | 1402356 A | 3/2003 |
|---|---|---|
| JP | 2005-175174 A | 6/2005 |
| JP | 4878739 B2 | 2/2012 |

OTHER PUBLICATIONS

Korean Office Action dated May 22, 2017 in corresponding Korean Patent Application No. 10-2012-0101712 (6 pages in Korean).
(Continued)

*Primary Examiner* — Nishath Yasmeen
(74) *Attorney, Agent, or Firm* — NSIP Law

(57) ABSTRACT

Provided is a power semiconductor device and a fabrication method thereof are provided. The power semiconductor device includes: a first epitaxial layer; a collector layer formed on one side of the first epitaxial layer; and a second epitaxial layer formed on another side of the first epitaxial layer, the first epitaxial layer having a higher doping concentration than the second epitaxial layer.

14 Claims, 7 Drawing Sheets

(51) Int. Cl.
*H01L 29/10* (2006.01)
*H01L 29/08* (2006.01)

(52) U.S. Cl.
CPC .. *H01L 29/66333* (2013.01); *H01L 29/66348* (2013.01); *H01L 29/7395* (2013.01); *H01L 29/7397* (2013.01)

(58) Field of Classification Search
CPC ........... H01L 29/7397; H01L 21/02013; H01L 21/304; H01L 21/463; H01L 21/67092; H01L 41/337; H01L 2224/03602; H01L 2224/11602; H01L 2224/27602
USPC ................. 438/690–693, 959, 977
See application file for complete search history.

(56) References Cited

U.S. PATENT DOCUMENTS

| | | | | |
|---|---|---|---|---|
| 6,225,649 | B1 * | 5/2001 | Minato | H01L 29/7397 257/133 |
| 7,645,659 | B2 | 1/2010 | Yun et al. | |
| 2001/0026977 | A1 * | 10/2001 | Hattori | H01L 29/1095 438/268 |
| 2002/0117712 | A1 * | 8/2002 | Matsudai | H01L 29/66333 257/330 |
| 2003/0042525 | A1 | 3/2003 | Tanaka | |
| 2007/0120215 | A1 * | 5/2007 | Yun | H01L 29/66333 257/496 |
| 2007/0290237 | A1 * | 12/2007 | Nakagawa | H01L 29/0834 257/273 |
| 2008/0054351 | A1 * | 3/2008 | Ooki | H01L 29/4236 257/330 |
| 2008/0296771 | A1 * | 12/2008 | Das | H01L 21/0475 257/758 |
| 2010/0052011 | A1 * | 3/2010 | Harada | H01L 29/0834 257/139 |
| 2011/0059612 | A1 | 3/2011 | Nakata et al. | |
| 2011/0121397 | A1 | 5/2011 | Pal et al. | |
| 2011/0151649 | A1 | 6/2011 | Cooper et al. | |
| 2011/0254088 | A1 * | 10/2011 | Darwish | H01L 29/407 257/340 |
| 2012/0286324 | A1 | 11/2012 | Lee | |

OTHER PUBLICATIONS

Chinese Office Action dated Jun. 2, 2017 in Corresponding Chinese Patent Application No. 201310317077.7 (7 pages in Chinese).

* cited by examiner

POWER SEMICONDUCTOR DEVICE AND FABRICATION METHOD THEREOF

CROSS-REFERENCE TO RELATED APPLICATION

The present application is a Divisional of U.S. patent application Ser. No. 13/915,810 filed Jun. 12, 2013, which claims the benefit under 35 U.S.C. § 119(a) of Korean Patent Application No. 10-2012-0101712 filed on Sep. 13, 2012, in the Korean Intellectual Property Office, the entire disclosures of which are incorporated herein by reference for all purposes.

BACKGROUND

1. Field

The following description relates to a power semiconductor device and a fabrication method thereof and to, for example, an insulated gate bipolar mode transistor (IGBT) and a power semiconductor device with improved resistivity dispersion which is implemented with such an IGBT.

2. Description of Related Art

In recent years, due to the shortage of energy, researches on energy-saving mechanisms and energy-efficient products and on alternative energy development have been actively taking place worldwide. With such a movement, interests in smart grids, electric vehicles, and photovoltaic power generation are increasing. As a result, the importance of a power conversion apparatus as one of the most important parts in such a system is being recognized. As power conversion apparatuses that are in use increase in their capacity, the modern power conversion apparatuses have to keep up with the demand for high current and high voltage operations, while still maintaining low on-resistance and fast response speed for efficiency, as well as operating at a high frequency to allow the minimization in size and weight of the overall device.

IGBTs are considered a suitable power semiconductor device to meet these demands. A shallow low concentration drift region enables reduction in on-resistance loss, implementation of high-frequency products with adjustment of switching speed through concentration adjustment of a P type collector region and moving time control of minority carriers, and implementation of high-voltage endurance (for example, above 1200 V) and high current (for example, several hundreds of amperes) in application to a module.

FIG. 1 illustrates a cross-sectional view of an example of an IGBT.

As illustrated in FIG. 1, an IGBT may include a substrate 100, a $P^+$ type region 110, an $N^+$ type region 120, a gate electrode 130, an emitter electrode 140, a field stop layer 150, and a $P^+$ type collector layer 160.

The high concentration field stop layer 150 reduces an electric field formed between the low concentration $N^-$ type substrate 100 and the $P^+$ type collector layer 160 gradually to 0 (zero) before the electric field reaches the $P^+$ type collector layer 160. FIG. 1 illustrates the changes in electric field along a depth of the IGBT. In the technology before using the field stop layer 150, a very thick substrate having a thickness of 200 µm were used to cause the electric field to be 0 (zero) in an off-state. Further, a doping concentration of the substrate has to be reduced to increase resistance. In this case, the doping concentration of the substrate is heavily changed to increase voltage overshoot, and the switching loss is relatively increased due to the thick substrate. Thus, a field stop layer 150 may be used to solve these issues.

When the field stop layer 150 is used, a thick substrate is not necessary. The substrate may have a relatively thin thickness of approximately 120 µm.

For example, as a substrate 100, an $N^-$ type drift region that is a floating zone (FZ) wafer may be used. The high concentration field stop layer 150 is formed on a rear side of the FZ wafer. That is, the field stop layer 150 is formed in the FZ wafer, and the FZ wafer is fabricated by implanting ions into an edge portion of an intrinsic wafer and diffusing the implanted ions. Therefore, the concentration distribution of the doped dopant in the FZ wafer is not uniform; the concentration is higher at the edge portion of the FZ wafer, and than is gradually reduced toward a center of the FZ wafer. Because the dopant concentration changes substantially according to a location within the FZ wafer, the voltage overshoot in the IGBT may increase and a swing width in a collector-emitter voltage Vce,sat may change substantially.

In an IGBT having such a structure, because the dopant concentration changes substantially based on the location within the FZ wafer, resistivity distribution of the substrate 100 may increase to more than 10%; as a result, the switching speed of the field stop layer 150 and the swing width in the collector-emitter voltage Vce,sat may also increase.

SUMMARY

In one general aspect, there is provided a power semiconductor device, including: a first epitaxial layer; a collector layer formed on one side of the first epitaxial layer; and a second epitaxial layer formed on another side of the first epitaxial layer, the first epitaxial layer having a higher doping concentration than the second epitaxial layer.

The collector layer may have a polished surface in a rear side thereof.

The first epitaxial layer may have resistivity dispersion in a range of less than 5%.

The second epitaxial layer may have resistivity dispersion in the same range as that of the first epitaxial layer.

The general aspect of the power semiconductor device may further include: a base region and a source region formed in the second epitaxial layer; a gate insulating layer and a gate electrode formed on the second epitaxial layer; an insulating layer formed on the gate electrode; and an emitter electrode formed on the second epitaxial layer.

The general aspect of the power semiconductor device may further include a trench having a preset depth from a surface of the second epitaxial layer; a gate insulating layer and a gate electrode formed in the trench; an insulating layer on the gate electrode; and an emitter electrode formed on the second epitaxial layer.

In another general aspect, there is provided a method of fabricating a power semiconductor device, the method involving: forming a first epitaxial layer on a substrate; a forming a second epitaxial layer on the first epitaxial layer; entirely removing the substrate to expose the first epitaxial layer; and grinding a rear side of the first epitaxial layer so that a partial thickness of the first epitaxial layer remains, wherein the first epitaxial layer has a higher doping concentration than the second epitaxial layer.

The grinded first epitaxial layer may be used as a field stop layer.

The grinded first epitaxial layer may have the thickness in a range of 5 to 25 µm.

The grinded first epitaxial layer may have resistivity dispersion in a range of less than 5%.

The second epitaxial layer may have resistivity dispersion in the same range as that of the first epitaxial layer.

The general aspect of the method may further involve forming a collect layer in the first epitaxial layer.

The forming of a collect layer may include: doping P type impurities in the grinded surface of the first epitaxial layer through ion implantation; and diffusing the P type impurities by performing an annealing process or a baking process.

The general aspect of the method may further involve: forming a base region and a source region in the second epitaxial layer; and forming a gate insulating layer, a gate electrode, and an emitter electrode on the second epitaxial layer.

The general aspect of the method may further involve processing the first epitaxial layer through an etching process using a chemical solution after the grinding.

The chemical solution may include at least one selected from the group consisting of sulfuric acid ($H_2SO_4$), nitric acid ($HNO_3$), and hydrogen fluoride (HF).

A weight-percent content of the chemical solution for obtaining a desired etch rate may satisfy a condition that $HF<HNO_3<H_2SO_4$.

The surface roughness of the first epitaxial layer processed through the etching process using the chemical solution may be in a range of 10 to 100 nm.

The general aspect of the method may further involve: forming a trench in the second epitaxial layer; forming a gate insulating layer and a gate electrode in the trench; forming a base region, a source region, a gate insulating layer, and an emitter electrode around the gate electrode; and grinding the substrate and the first epitaxial layer so that a partial thickness of the first epitaxial layer remains, thereby forming the field stop layer.

In another general aspect, there is provided a method of fabricating a power semiconductor device, the method involving: forming a second epitaxial layer on a first surface of a first epitaxial layer; polishing a second surface of the first epitaxial layer, the first epitaxial layer having a higher doping concentration than the second epitaxial layer; forming a collector layer by implanting ions on the polished second surface of the first epitaxial layer, wherein the power semiconductor device is an insulated gate bipolar mode transistor.

The general aspect of the method may further involve forming a collector electrode on the collector layer by depositing a conductor material, wherein the insulated gate bipolar mode transistor includes the second epitaxial layer, the first epitaxial layer, the collector layer and the collector electrode arranged in that order.

Other features and aspects may be apparent from the following detailed description, the drawings, and the claims.

Figure 1:
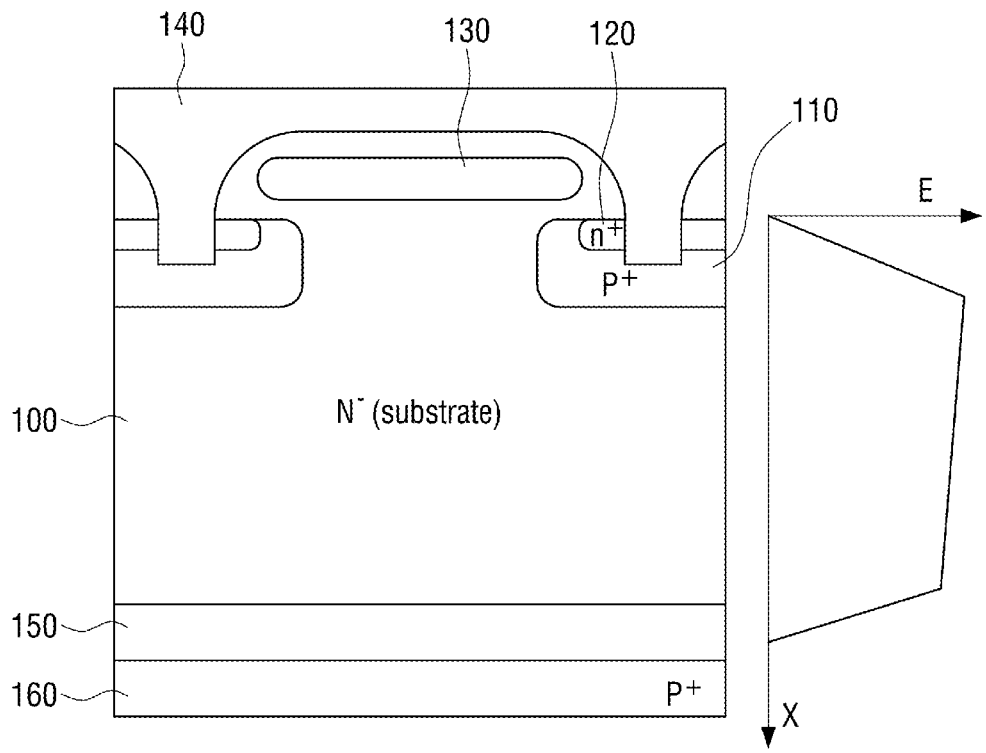
FIG. 1 is a cross-sectional view schematically illustrating an FS IGBT.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

Also, embodiments of the inventive concept may be described with reference to schematic cross-sectional views or plan views, which are schematic diagrams of idealized example embodiments of the inventive disclosure. As such, variations from the shapes of the illustrations, as a result, for example, of manufacturing techniques and/or tolerances, are to be expected. For example, an etched region illustrated in a right angle may be in the rounded shape or in the shape of having a predetermined curvature. Thus, examples should not be construed as being limited to the particular shapes of regions illustrated herein, but are to include deviations in shapes that result from, e.g., a manufacturing process. Thus, the regions illustrated in the drawings are schematic in nature and are not intended to limit the scope of the inventive concept.

Like reference numerals designate like elements throughout the specification. Therefore, even though identical or similar reference numerals are not described in the corresponding drawing, they may be described with reference to the other drawings. Also, even though no reference numeral is indicated, it may be described with reference to the other drawings.

Figure 2:
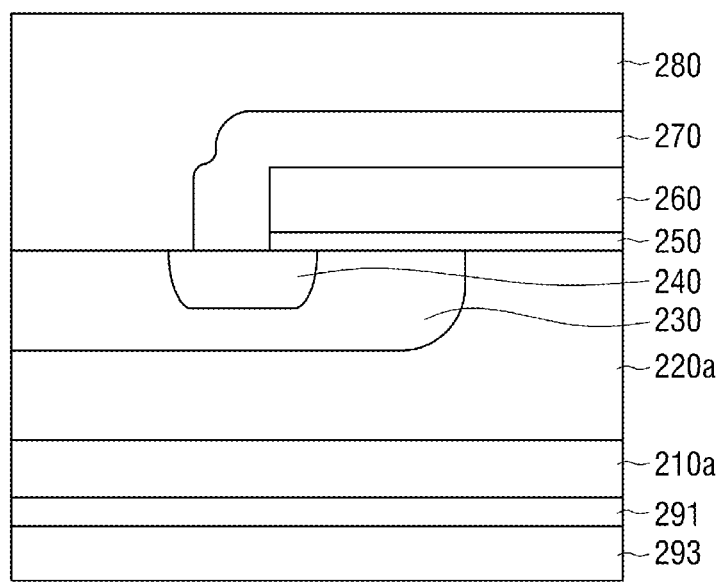
FIG. 2 is a cross-sectional view illustrating an example of a power semiconductor device.

FIG. 2 is a cross-sectional view illustrating an example of a power semiconductor device. The power semiconductor device is an IGBT according to a general aspect.

As illustrated in FIG. 2, a power semiconductor device includes, all or a portion of, a first epitaxial layer 210a, a second epitaxial layer 220a, a gate insulating layer 250, a gate electrode 260, an insulating layer 270, an emitter electrode 280, a P$^+$ type collector layer 291, and a collector electrode 293.

The first epitaxial layer 210a may be, for example, an N type epitaxial layer and may have low resistivity and a high concentration. In this example, the first epitaxial layer 210a may be formed to have a thickness in a range of about 5 to 25 μm. However, the thickness of the first epitaxial layer 210a is not limited thereto, but the first epitaxial layer 210a may be thinner than the second epitaxial layer 220a. The first epitaxial layer 210a may have resistivity of 1 to 5 ohm·cm and resistivity dispersion within 5% of a median value.

That is because the thickness and concentration of the first epitaxial layer 210a is determined by main characteristics of the IGBT device such as, for example, switching speed and the collector-emitter voltage Vce,sat.

Since the first epitaxial layer 210a formed through an epitaxial growth method is used as the field stop layer, the field stop layer may have uniform resistivity as compared with the field stop layer using a substrate fabricated by a FZ or Czochralski (CZ) method. This is because the resistivity dispersion of the substrate fabricated by a FZ method, a CZ method, or the like itself is more than 10%. For example, an N-doped layer is epitaxial-grown on an N$^0$ semiconductor substrate in which N type impurities are doped. A rear side of the N$^0$ semiconductor substrate is polished or grinded to form a substrate having a thin thickness. Therefore, a substantial field stop layer is formed. However, as the N$^0$ semiconductor substrate, a CZ wafer manufactured by a CZ method is used. Therefore, the CZ wafer is not entirely removed but partially remains so that the remaining wafer itself is used as the field stop layer. Since the CZ wafer is manufactured in large quantities, the resistivity value changes according to the dispersion for wafers (or the dispersion in an ingot); thus, the resistivity dispersion in the wafer is much larger than that of an epitaxial layer formed by an epitaxial growth method. Consequently, the change in the switching speed and a swing width in the collector-emitter voltage in the CZ wafer are substantial in comparison to such an epitaxial layer. Therefore, the reliability and stability of the device may significantly degrade as compared with a device obtained using an epitaxial layer as the field stop layer. The voltage overshoot in the wafer and a switching width of the switching speed or a switching width in the collector-emitter voltage may be reduced, and become uniform. Therefore, the swing width of the switching speed or the swing width in the collector-emitter voltage according to lot-to-lot or wafer-to-wafer is reduced.

For example, after the first epitaxial layer 210a is formed on a substrate such as a wafer, the substrate is removed completely by polishing, expose a rear side of the first epitaxial layer 210a. Subsequently, the rear side of the first epitaxial layer 210a is polished further, removing a fixed thickness of the first epitaxial layer 210a; thus, the remaining first epitaxial layer 210a has a different thickness from that of the first epitaxial layer that was initially formed. Therefore, the first epitaxial layer 210a may have a polishing layer or a polished surface in the rear side thereof. The remaining polishing layer serves as a field stop layer. The polished first epitaxial layer 210a may be referred to as the field stop layer in that the first epitaxial layer 210a blocks diffusion of an electric field.

A high concentration field stop layer is used reduce an electric field formed between the second epitaxial layer and the P$^+$ type collector gradually to 0 (zero) before reaching the P$^+$ type collector layer 291. Therefore, in this example, the first epitaxial layer 210a serving as the field stop layer has to have a high concentration; the concentration is higher than the concentration of dopant in the substrate. When a resistivity value of the first epitaxial layer 210a is reduced, an amount of high concentration hole injection is reduced and a decay time of the hole is shortened so that turn-off speed is increased.

The second epitaxial layer 220a is formed on the first epitaxial layer 210a. The second epitaxial layer 220a is thicker in thickness than the first epitaxial layer 210a and has resistivity higher than that of the first epitaxial layer 210a. The arrangement enables the second epitaxial layer 220a to endure a high voltage in a range of 600 to 1700 V. Therefore, the second epitaxial layer 220a has a much greater thickness than the first epitaxial layer 210a and has resistivity that is higher than that of the first epitaxial layer 210a.

In an example, the thickness of the second epitaxial layer 220a may be adjusted according to a breakdown voltage or an endurance voltage. For example, the thickness of the second epitaxial layer 220a may be determined based on a voltage applied to the second epitaxial layer 220a. The second epitaxial layer 220a may have a resistivity dispersion value that is within a 5% range of a median value, like that of the first epitaxial layer.

The second epitaxial layer 220a may include a base region (or a base junction region) 230 having a fixed depth from an upper surface of the second epitaxial layer 220a and the N$^+$ type source region 240 formed in the base region 230. When the base region 230 is a P type region, the N$^+$ type source region 240 may be an N type region. The base region 230 and the N$^+$ type source region 240 are formed by selectively doping P type impurities and N type impurities into the second epitaxial layer 220a and diffusing the P type and N type impurities.

The gate insulating layer 250 is formed on one region of a surface of the second epitaxial layer 220a. The one region may include portions of the P type base region 230 and the N$^+$ type source region 240 in the second epitaxial layer 220a. For example, the gate insulating layer 250 may include a silicon oxide layer and may be formed to have a thickness of about 500 Å to 2000 Å. For example, the gate insulating layer 250 may be formed by forming a gate insulating material on an entire surface of the second epitaxial layer 220a and then partially removing the gate insulating material. The gate insulating material may be partially removed through a photolithographic process. For example, a photoresist may be coated on the entire surface of the second epitaxial layer 220a and patterned through an exposing and developing process using a mask, and the gate insulating material may be etched using the photoresist pattern to form the gate insulating layer 250.

In this example, the gate electrode 260 is formed on the gate insulating layer 250. The gate electrode 260 may be formed of polysilicon or a conductive metal material. The gate electrode 260 is formed by forming a gate electrode material on the entire surface of the second epitaxial layer 220a and performing a photolithographic process on the gate electrode material. The gate electrode 260 may be formed by sequentially depositing a gate insulating material and a gate electrode material on the second epitaxial layer 220a and performing a photolithographic process on the gate insulating material and the gate electrode material.

The insulating layer 270 is formed on the second epitaxial layer 220a to electrically isolate the gate electrode 260 from the emitter electrode 280. The insulating layer 270 may serve as a kind of protection layer. The insulating layer 270 may be formed by forming an insulating material on the entire surface of the second epitaxial layer 220a to cover the gate electrode 260 and then partially removing the insulating material to expose a portion of the base region 230 in the second epitaxial layer 220a.

The emitter electrode 280 is formed on the second epitaxial layer 220a and the insulating layer 270. For example, the emitter electrode 280 may be formed of tungsten (W), aluminum (Al), copper (Cu), or the like.

The $P^+$ type collector layer 291 is formed on the rear side of the first epitaxial layer 210a that has been grinded to a fixed thickness and serves as a field stop layer. The P+ type collector layer 291 may be formed, for example, by performing ion implantation of P type impurities and performing baking. The P+ type collector layer 291 may be used as a P type collector.

Referring to FIG. 2, the collector electrode 293 is formed on the $P^+$ type collector layer 291. The collector electrode 293 may be formed of the same material as the emitter electrode 280, but the formation of the collect electrode 293 is not limited thereto. The collector electrode 293 may be formed by depositing a specific metal material. Alternatively, the collector electrode 293 may be deposited through a printing process that involves printing a metal material or a rolling process other than a photolithographic process.

In this example, first, the substrate is removed in the backgrinding process. Sequentially, a grinding process is performed on the first epitaxial layer 210a so that the first epitaxial layer 210a that remains has a fixed thickness. Therefore, the first epitaxial layer 210a has low dispersion and significantly serves as an electric field stop layer in a reverse mode operation. For example, since the N type field stop layer formed of the epitaxial layer has low concentration dispersion, a certain amount of holes are recombined so that uniform and constant characteristics of switching speed and a collector-emitter voltage Vce,sat may be obtained.

Figure 3:
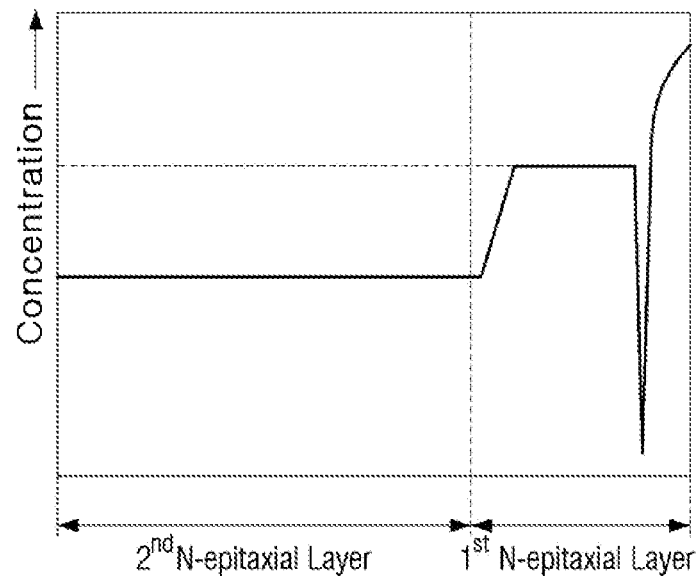
FIG. 3 is a view illustrating an example of a concentration profile of the power semiconductor device of FIG. 2.

FIG. 3 illustrates a concentration profile of the example of a power semiconductor device illustrated in FIG. 2.

Referring to FIGS. 2 and 3, in the example, a dopant concentration of the first epitaxial layer 210a serving as a depletion stop layer is different from that of the second epitaxial layer 220a. Specifically, the dopant concentration of the first epitaxial layer 210a is higher than that of the second epitaxial layer 220a. Also, the first epitaxial layer 210a is formed to have a thickness in a range of about 10 to 30 μm through a backgrinding process, and the first epitaxial layer 210a has a higher concentration than the second epitaxial layer 220a. The second epitaxial layer 220a is thicker than the first epitaxial layer 210a. Each of the impurity concentration in the first epitaxial layer 210a and the impurity concentration in the second epitaxial layer 220a may be maintained substantially in a constant profile. The first and second epitaxial layers have uniform resistivity dispersion from when the first and second epitaxial layers are grown. Thus, the first and second epitaxial layers have a constant impurity concentration profile.

FIGS. 4 to 7 illustrate an example of a process of fabricating the power semiconductor device illustrated in FIG. 2.

Figure 4:
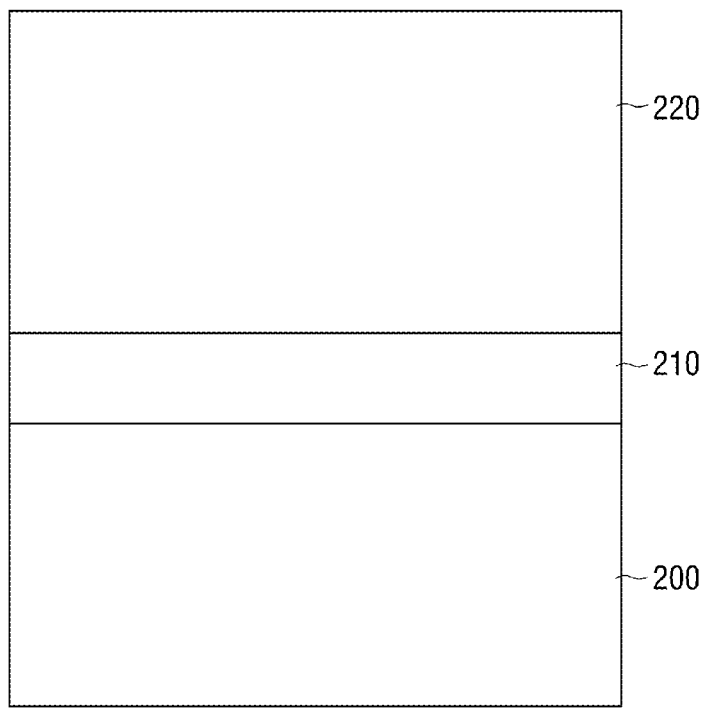
FIGS. 4 to 7 are views illustrating an example of a process of fabricating the power semiconductor device of FIG. 2.

Referring to FIG. 4, a first silicon epitaxial layer 210 and a second silicon epitaxial layer 220 are first sequentially formed on a substrate 200 having a thickness of 600 to 800 μm. In this example, in terms of the cost of fabrication, the substrate 200 may be formed with a low-price wafer. The wafer may include a CZ wafer fabricated by a CZ method suitable for a large-diameter wafer fabrication or a test wafer. When the lightly doped N type substrate is used, the substrate has resistivity of about 50 ohm·cm. The substrate 200 is entirely removed in a subsequent process through a grinding or polishing process; thus, the resistivity and dispersion of the substrate is not important.

As seen from FIG. 4, the second silicon epitaxial layer 220 may be thicker than the first silicon epitaxial layer 210 and have higher resistivity than the first silicon epitaxial layer 210. A native oxide formed on the substrate is removed, and then the epitaxial layers are formed. The epitaxial layers are formed by using trichlorosilane (TCS, $SiHCl_3$) gas at a temperature of 1080 to 1190° C. To adjust the resistivity of the epitaxial layer, phosphene ($PH_3$) or arsine ($AsH_3$) gas is used as a dopant when the epitaxial layer has an N type; diborane ($B_2H_6$) gas is used when the epitaxial layer has a P type. The N type epitaxial layer and the P type epitaxial layer have a very uniform doping concentration; the doping concentrations thereof may be adjusted in a range of 1E13 to 1E20 atoms/$cm^3$ according to a doping condition. Further, $H_2$ carrier gas may be used.

In this example, to form the N type first silicon epitaxial layer 210 having resistivity of 1 to 5 ohm·cm, a mixture gas of TCS, $PH_3$, and $H_2$ is used. To form the N type first silicon epitaxial layer 210 having resistivity of 1 to 5 ohm·cm, a doping concentration of an N type dopant in the N type first silicon epitaxial layer 210 may be in a range of 5E14 to 1E16 atoms/$cm_3$. Further, to form the N type second silicon epitaxial layer 220 having resistivity of 10 to 80 ohm·cm, a doping concentration of an N type dopant in the N type second silicon epitaxial layer 220 may be in a range of 1E13 to 4E14 atoms/$cm^{-3}$. The second silicon epitaxial layer 220 may be deposited using $PH_3$ gas that is used as a dopant for forming the second silicon epitaxial layer 220. The second silicon epitaxial layer 220 may have a lower concentration than that of the dopant for forming the first silicon epitaxial layer 210.

In this example, the high concentration first silicon epitaxial layer 210 is deposited to a thickness of 30 to 50 μm, as depicted in FIG. 4. The low concentration second silicon epitaxial layer 220 is deposited to a thickness of 45 to 150 μm, as depicted in FIG. 4. The thickness of the second silicon epitaxial layer 220 is changed according to a breakdown voltage of the IGBT device. When the breakdown voltage is 600 V, the second silicon epitaxial layer 220 is deposited to a thickness of 45 to 70 μm. The first silicon epitaxial layer 210 and the second silicon epitaxial layer 220 may be formed by being bonded to the substrate 200 in a raw material form in which the first silicon epitaxial layer 210 and the second silicon epitaxial layer 220 are combined with each other, as depicted in FIG. 4. At this time, the epitaxial layer may have a double epitaxial layered structure.

Figure 5:
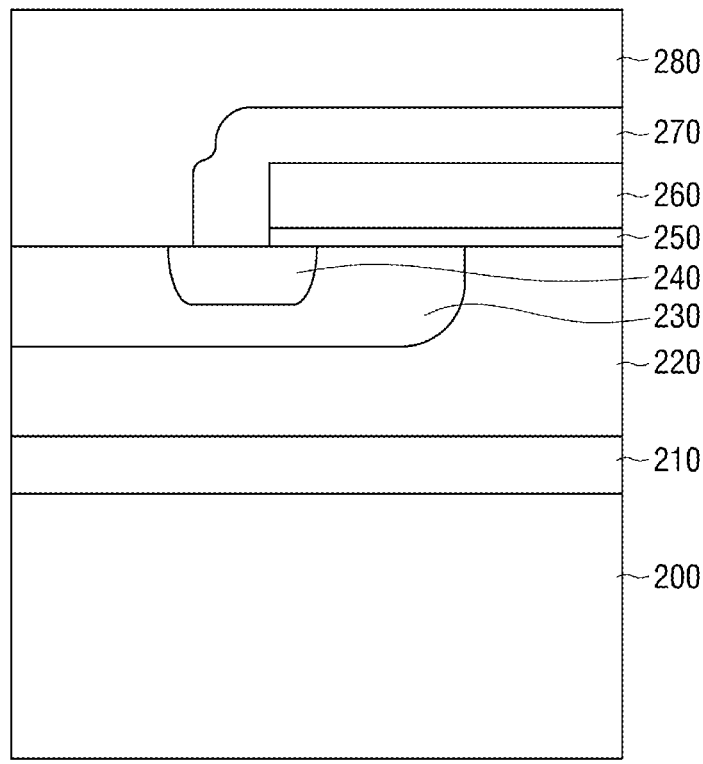

As illustrated in FIG. 5, a base region 230 and an N+ type source region 240 are formed in fixed thicknesses from a surface of the second silicon epitaxial layer 220 in the second silicon epitaxial layer 220 of the substrate 200. The base region 230 has a P type. The base region 230 and the source region 240 may be formed through selective doping and diffusing of P type impurities and N type impurities. In this example, the second silicon epitaxial layer 220 in which the base region 230 and the $N^+$ type source region 240 are formed may be referred to as a second epitaxial layer 220a.

A gate insulating layer 250, a gate electrode 260, an insulating layer 270, and an emitter electrode 280 are formed on the second epitaxial layer 220a. The gate insulating layer 250 is formed of a silicon oxide layer. The gate insulating layer 250, gate electrode 260, and insulating layer 270 may be formed by forming corresponding materials on an entire surface of the second epitaxial layers 220a and performing corresponding photolithographic processes on the corresponding materials, respectively.

Figure 6:
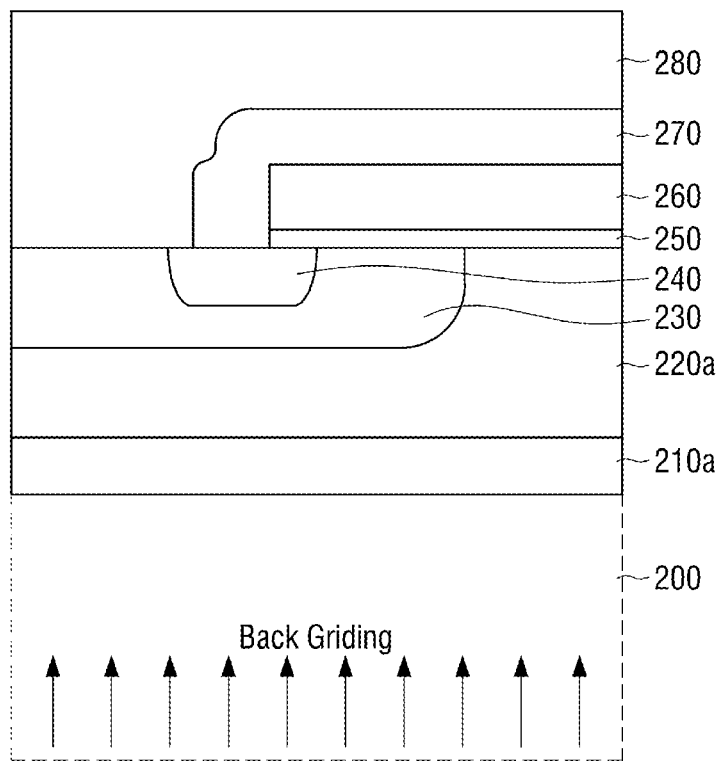

As illustrated in FIG. 6, a grinding process or a polishing process is performed on a rear side of the substrate 200. The substrate 200 having a thickness of 600 to 800 µm is completely removed through the grinding process. The semiconductor substrate is removed to expose the first silicon epitaxial layer 210. A portion of the first silicon epitaxial layer 210 is grinded, thus leaving a first epitaxial layer having a specific thickness. As the removed thickness of the first silicon epitaxial layer 210 increases, the backside of the first silicon epitaxial layer 210 may become substantially uneven. Therefore, the maximum thickness of the first silicon epitaxial layer 210 that may be removed through a backgrinding process may be 15 µm or less. Therefore, the first epitaxial layer that is removed by the fixed thickness becomes the first epitaxial layer 210a.

Since the rear side of the first epitaxial layer 210a has a very large unevenness of about 3 to 4 µm after the backgrinding process, an etching process may be additionally performed using a chemical solution to alleviate the unevenness. Through the additional process, a precise thickness target value, for example, a final thickness of the first epitaxial layer 210a in a range of 5 to 25 µm may be obtained. The additional etching process is performed because it is difficult to adjust the thickness accurately with the grinding process. Since an etch rate of a chemical solution is known, a precise control of thickness is possible through the use of a wet etching process. In this example, the thickness removed through an etching process is 5 to 10 µm. As an amount of etching in the wet etching is increased, the degree of alleviating the unevenness of the first epitaxial layer 210a formed of silicon is reduced. Thus, the minimum amount of etching that may be performed may be 5 µm and the maximum amount of etching may be 10 µm or less.

A chemical solution used in such a wet etching process may include a solution containing $H_2SO_4$, $HNO_3$, HF, or a combination thereof. The silicon (Si) of the first epitaxial layer is etched by these component contained in the chemical solution. To obtain a desired etch rate, contents (wt %) of the components are controlled so that $HF<HNO_3<H_2SO_4$. The amount of sulfuric acid ($H_2SO_4$) is largest among the components to easily form an oxide layer after silicon etching. The etching and oxidation may be simultaneously performed, alleviating the surface unevenness. The unevenness or surface roughness (root mean square (RMS)) may be controlled to a range of 10 to 100 nm through a mixed chemical solution process. Through the above-described process, a $P^+$ type collector layer 291 may be uniformly formed in a subsequent process.

Here, the first epitaxial layer 210a is used as a field stop layer. Since the field stop layer is formed through polishing of the rear side of the silicon epitaxial layer, an ion implantation process with high energy and an annealing diffusion process with a high temperature of 800° C. or more for forming the field stop layer are not necessary. The first epitaxial layer 210a formed through the above-described process may have a different thickness from the first epitaxial layer 210a initially formed on the substrate 200. In this example, the first epitaxial layer 210a may have a thickness in a range of 5 to 25 µm after the grinding process and the chemical wet etching process. For example, the thickness range of 5 to 25 µm may be differently determined according to a collector-emitter voltage Vce,sat due to a breakdown voltage and resistivity dispersion of the substrate 200 and the switching dispersion when a FS IGBT is implemented. A total thickness of the finally remaining first epitaxial layer 210a and second epitaxial layer 220a is very thin; for example, the total thickness of each of the layers may be in a range of about 50 to 100 µm.

Figure 7:
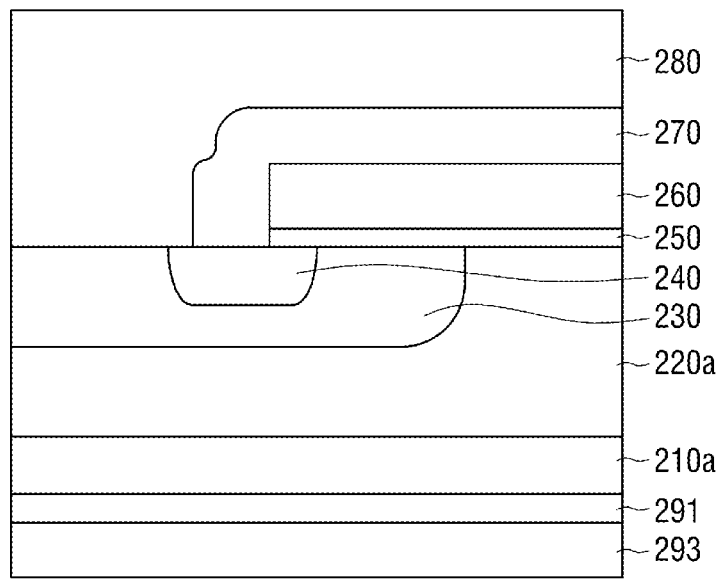

As illustrated in FIG. 7, a $P^+$ type collector layer 291 is formed in the rear side of the first epitaxial layer 210a. The $P^+$ type collector layer 291 is formed in the exposed rear side of the first epitaxial layer 210a serving as a field stop layer by doping p type impurities into the rear of the first epitaxial layer 210a through an ion implantation process and diffusing the p type impurities through an annealing or baking process. For instance, the annealing or baking process may be performed in a temperature of 500° C. or less; thus, a constant concentration profile of the first epitaxial layer 210a serving as a field stop layer that has been previously formed is not changed. Since the N type first silicon epitaxial layer has a doping concentration in a range of 5E14 to 1E16 atoms/cm³, the concentration of the p type impurities for the $P^+$ type collector layer 291 has to be higher than that of the N type impurities for the N type first epitaxial layer. Therefore, the ion implantation process has to be performed so that the $P^+$ type collector region 291 has a doping concentration in a range of 1E16 to 1E18 atoms/cm³.

The P type impurities are implanted into the rear side of the first epitaxial layer 210a. Thus, the $P^+$ type collector layer 291 is formed in the first epitaxial layer 210a. Therefore, the field stop layer together with the $P^+$ type collector layer 291 are formed in the first epitaxial layer 210a having the thickness of 5 to 25 µm. Therefore, the first epitaxial layer 210a has to maintain a sufficient thickness to form the two layers therein. Since the $P^+$ type collector layer 291 is formed in the first epitaxial layer 210a, the collector having very low metal contamination may be obtained. Finally, a metal material is deposited on the $P^+$ type collector layer 291 to form a collector electrode 293.

Figure 8:
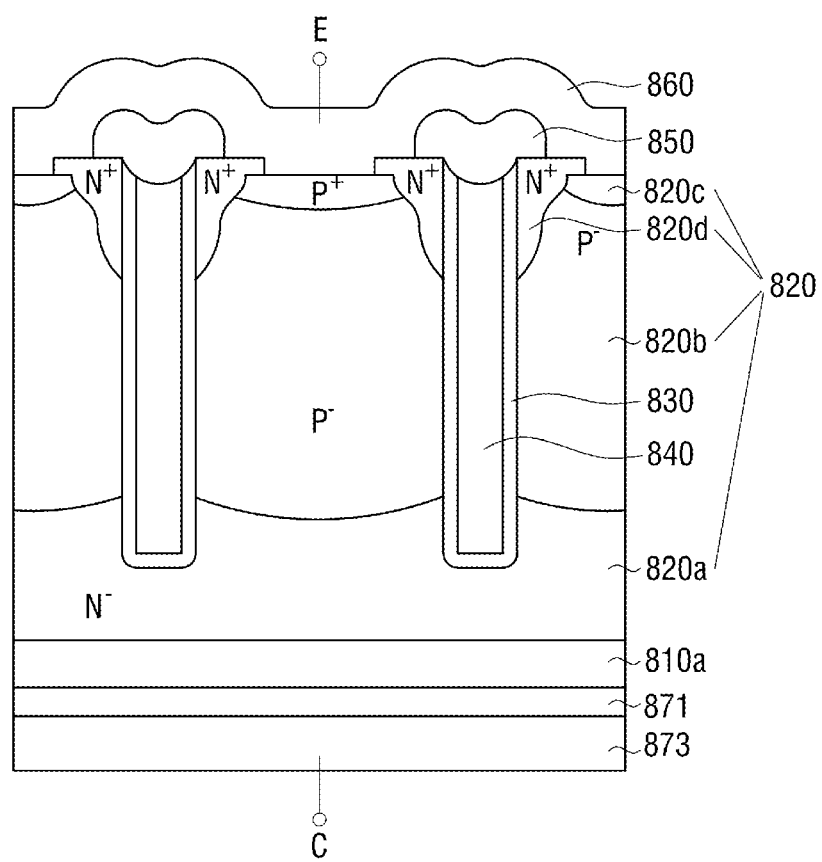
FIG. 8 is a cross-sectional view illustrating another example of a power semiconductor device.

FIG. 8 is a cross-sectional view illustrating an example of a power semiconductor device according to another general aspect.

As illustrated in FIG. 8, in this example, a power semiconductor device having a trench FS IGBT structure includes, all or a portion of, a first epitaxial layer 810a, a second epitaxial layer 820, a gate insulating layer 830, a gate electrode 840, an insulating layer 850, an emitter electrode 860, and a $P^+$ type collector layer 871, and a collector electrode 873.

The power semiconductor device illustrated in FIG. 8 is different from the power semiconductor device of the first general aspect illustrated in FIG. 2 in that: a trench is formed in the second epitaxial layer 820, the gate insulating layer 830 is formed within the trench, and the gate electrode 840 is formed of doped polysilicon on the gate insulating layer 830 within the trench.

For example, the second epitaxial layer 820 is formed on the first epitaxial layer 810a. The second epitaxial layer 820 has a trench for formation of the gate electrode 840 and the gate insulating layer 830 such as a silicon oxide layer is formed on an inner surface of the trench, and the gate electrode 840 is formed in the trench. In the example illustrated in FIG. 8, the second epitaxial layer 820 includes a low concentration N⁻ type doping region 820a formed by initially implanting low concentration N type impurities into the second epitaxial layer 820, a low concentration P⁻ doping region 820b formed by implanting low concentration P type impurities into the N⁻ type doping region 820a, a high concentration P⁺ doping region 820c formed by selectively implanting high concentration P type impurities into the P⁻ type doping region 820b, and a high concentration N⁺ doping region 820d formed by selectively implanting high concentration N⁺ type impurities into the P⁻ type doping region 820b. The trench may be formed to have a fixed depth from a surface of the second epitaxial layer 820 on the basis of the high concentration N⁺ type doping region 820d after the second epitaxial layer 820 having the doping regions 820a to 820d is formed. The insulating layer 850 that electrically insulates the gate electrode 840 formed in the trench from the emitter electrode 860 is formed on the trench so that the gate electrode 840 is buried within the trench. Further, the P⁺ type collector layer 871 and the collector electrode 873 are formed on the rear side of the first epitaxial layer 810a.

Figure 9:
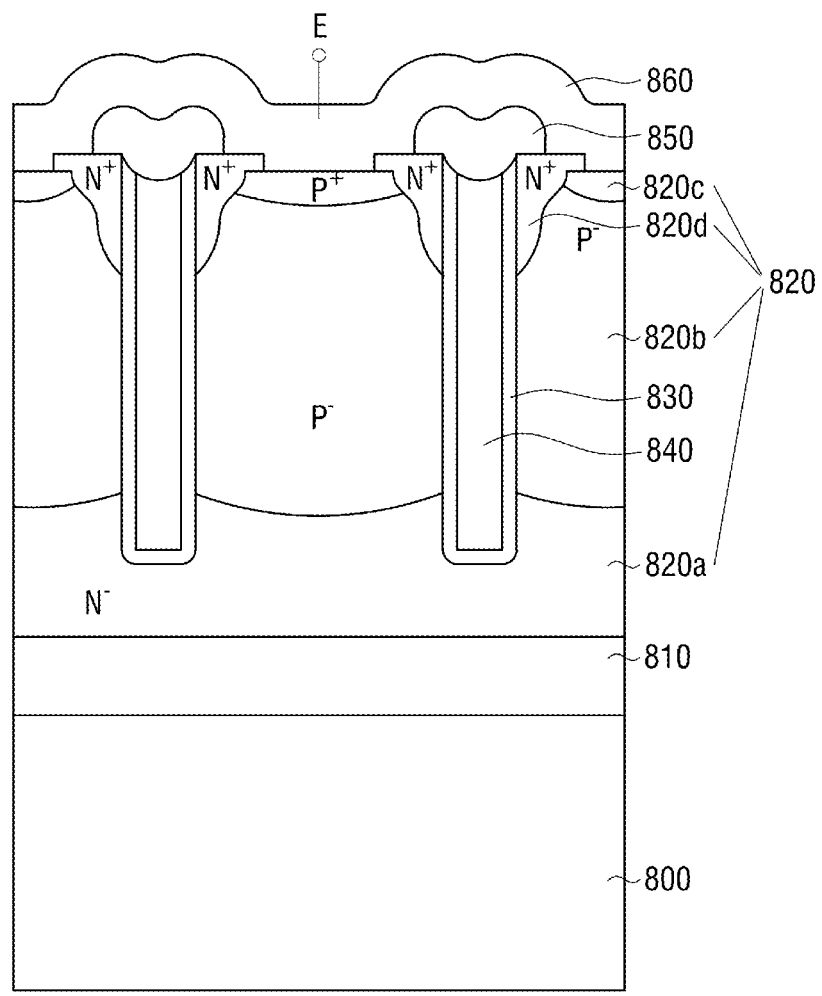
FIGS. 9 to 11 are views illustrating an example of a process of fabricating the power semiconductor device of FIG. 8.
Figure 10:
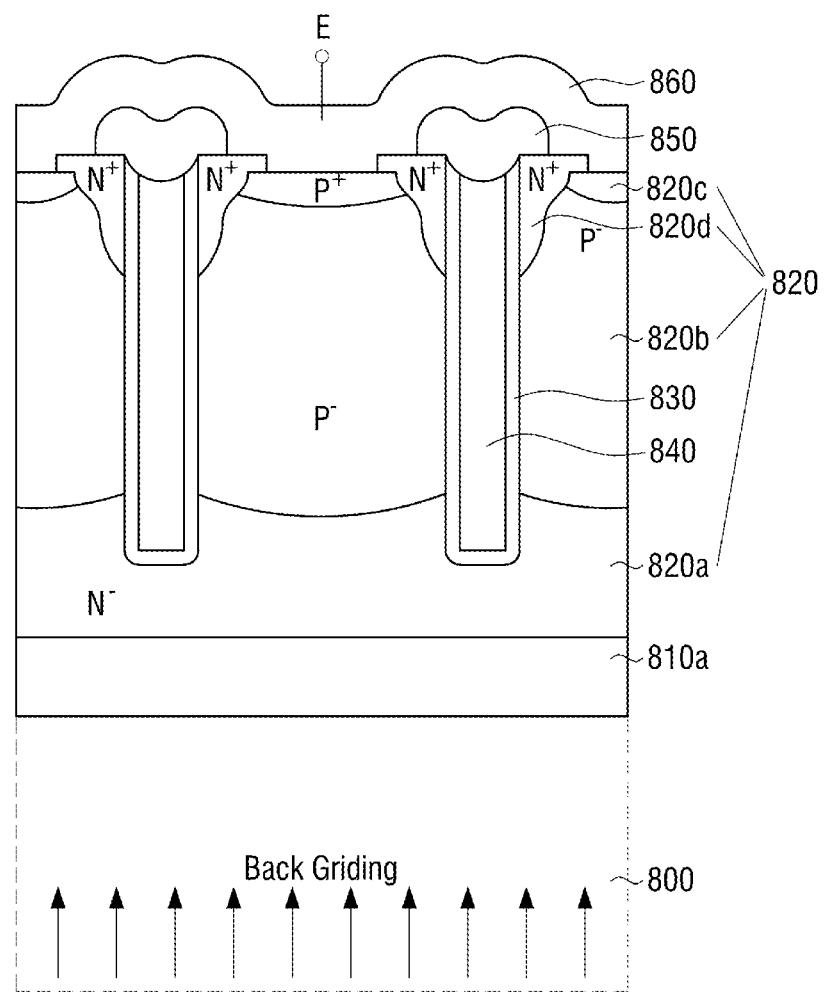
Figure 11:
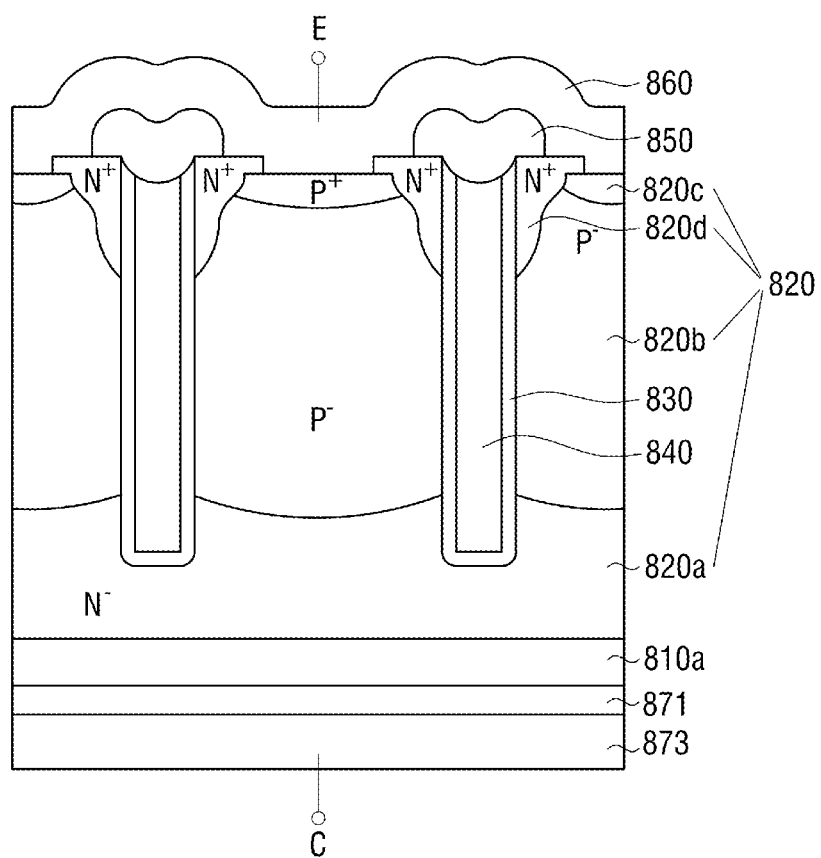

FIGS. 9 to 11 illustrate an example of a process of fabricating the power semiconductor device illustrated in FIG. 8.

Referring to FIGS. 9 to 11 with respect to FIG. 8, the example of a method of fabricating a power semiconductor device first involves forming a first epitaxial layer 810 on a substrate 800 such as a wafer. For example, the wafer may include a CZ wafer manufactured by a CZ method advantageous for a large-diameter wafer production or a test wafer.

Subsequently, a second silicon epitaxial layer (not shown) is formed on the first silicon epitaxial layer 810 and a doping and diffusing process of low concentration N⁻ type impurities is performed on the second epitaxial layer so that a doping region 820a is formed in the second silicon epitaxial layer. The second epitaxial layer having the doping region 820a may be formed by simultaneously performing an epitaxial growth process and a doping and diffusing process as well as by forming an epitaxial layer and then performing a separate doping process on the epitaxial layer. Therefore, the method of forming the second epitaxial layer is not limited thereto. Subsequently, on the second epitaxial layer having the low concentration N⁻ type doping region 820a, a doping and diffusing process of low concentration P⁻ type impurities is performed, a selective doping and diffusing process of high concentration P⁺ type impurities is performed, a selective doping and diffusing process of high concentration N⁺ type impurities is performed so that the second silicon epitaxial layer 820 having doping regions 820a to 820d are formed.

A trench having a fixed depth from a surface of the second silicon epitaxial layer 820 is formed in the second silicon epitaxial layer 820 on the basis of the doping region 820d formed through the selective doping and diffusing process of high concentration N type impurities.

An insulating layer is formed on an inner surface of the trench. An entire surface of the second epitaxial layer 820 and the insulating layer is partially removed, for example, through a photolithographic process to form a gate insulating layer 830 only on a bottom and sidewall of the trench.

Subsequently, an electrode material is formed on the entire surface of the second silicon epitaxial layer 820 to be buried within the trench. Then, a photolithographic process is performed on the gate electrode material to form a gate electrode 840 within the trench.

An insulating material is formed on the second silicon epitaxial layer 820 to be buried within the trench. A photolithographic process is performed on the insulating material to form an insulating layer 850, which allows the gate electrode 840 to is buried within the trench and electrically insulates the gate electrode 840 from an emitter electrode 860 to be formed in a subsequent process, on the trench.

The emitter electrode 860 is formed on the surface of the second silicon epitaxial layer 820 including the insulating layer 850.

Finally, as illustrated in FIG. 10, a polishing or grinding process is performed on a rear side of the substrate 800. The substrate 800 is entirely removed through a grinding process. The first silicon epitaxial layer 810 is exposed by the entire removal of the semiconductor substrate. Further, the exposed first silicon epitaxial layer 810 is further partially grinded to form a first epitaxial layer 810a of which a fixed thickness is removed. As described in the first example, a wet etch process using a mixed chemical solution is performed on the grinded first epitaxial layer 810a. The processing condition is similar to that of examples explained above. A precise thickness adjustment of the first epitaxial layer together with a precise concentration adjustment is very important to ensure uniform characteristics of the IGBT.

Subsequently, a P⁺ type collector layer 871 is formed in the grinded surface of the first epitaxial layer 810a having a remaining constant thickness. Therefore, the P⁺ type collector layer 871 is formed in the first epitaxial layer 810a serving as a field stop layer by doping P⁺ type impurities into the rear side of the first epitaxial layer 810a through ion implantation and diffusing the P⁺ type impurities through an annealing or baking process. Accordingly, the field stop layer and the P+ type collector layer 871 are formed in the first epitaxial layer having 810a a thickness of 5 to 25 μm. Therefore, the first epitaxial layer 810a has to maintain a sufficient thickness so that two layers are to be formed therein. The P⁺ type collector layer 871 is formed in the first epitaxial layer 810a. Thus, the P⁺ type collector layer 871 having very low metal contamination may be obtained. Subsequently, a metal material is deposited on the P⁺ type collector layer 871 to form a collector electrode 873.

Various examples described above relate to a power semiconductor device capable of improving characteristic dispersion according to change in a dopant concentration and resistivity of the substrate when the power semiconductor device is implemented with a field stop (FS) IGBT, and to a fabrication method of such a power semiconductor device.

For example, a power semiconductor device may include: a high concentration first epitaxial layer; a field stop layer and a collector layer formed in the first epitaxial layer; and a low concentration second epitaxial layer formed on the first epitaxial layer. The first epitaxial layer may have a polished surface in a rear side thereof. The first epitaxial layer may have resistivity dispersion in a range of less than 5%. The second epitaxial layer may have resistivity dispersion in the same range as that of the first epitaxial layer.

The power semiconductor device may further include: a base region and a source region formed in the second epitaxial layer; a gate insulating layer and a gate electrode formed on the second epitaxial layer; an insulating layer formed on the gate electrode; and an emitter electrode formed on the second epitaxial layer.

The power semiconductor device may further include: a trench having a preset depth from a surface of the second epitaxial layer; a gate insulating layer and a gate electrode formed in the trench; an insulating layer on the gate electrode; and an emitter electrode formed on the second epitaxial layer.

Other examples relate to methods of fabricating a power semiconductor device, which may involve: forming a high concentration first epitaxial layer on a substrate; a forming a low concentration second epitaxial layer on the first epitaxial layer; entirely removing the substrate to expose the first epitaxial layer; and grinding a rear side of the first epitaxial layer so that a partial thickness of the first epitaxial layer remains. The grinded first epitaxial layer may be used as a field stop layer. The grinded first epitaxial layer may have the thickness in a range of 5 to 25 µm. The first epitaxial layer may have resistivity dispersion in a range of less than 5%. The second epitaxial layer may have resistivity dispersion in the same range as that of the first epitaxial layer.

The method may further include forming a collect layer in the first epitaxial layer. The forming a collect layer may include doping P type impurities in the grinded surface of the first epitaxial layer through ion implantation, and diffusing the P type impurities by performing an annealing process or a baking process.

The method may further include: forming a base region and a source region in the second epitaxial layer; and forming a gate insulating layer, a gate electrode, and an emitter electrode on the second epitaxial layer.

The method may further include processing the first epitaxial layer through an etching process using a chemical solution after the grinding. The chemical solution may include at least one selected from the group consisting of sulfuric acid ($H_2SO_4$), nitric acid ($HNO_3$), and hydrogen fluoride (HF). A content (wt %) of the chemical solution for obtaining a desired etch rate may satisfy a condition that $HF<HNO_3<H_2SO_4$. The surface roughness of the first epitaxial layer processed through the etching process using the chemical solution may be in a range of 10 to 100 nm.

The method may further include: forming a trench in the second epitaxial layer; forming a gate insulating layer and a gate electrode in the trench; forming a base region, a source region, a gate insulating layer, and an emitter electrode around the gate electrode; and grinding the substrate and the first epitaxial layer so that a partial thickness of the first epitaxial layer remains, thereby forming the field stop layer.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A power semiconductor device, comprising:
   a trench formed in a substrate;
   a gate insulating layer formed along a surface of the trench;
   a gate electrode formed on the gate insulating layer;
   a drift region formed adjacent to the trench;
   a body region formed on the drift region;
   a source region formed in the body region;
   an interlayer insulating layer formed on the gate electrode,
   wherein a bottommost surface of the interlayer insulating layer on the gate electrode has a concave shape and is lower than a topmost surface of the source region;
   a body contact region formed adjacent to the source region; and
   an emitter electrode formed on the interlayer insulating layer,
   wherein the topmost surface of the source region contacting the emitter electrode is higher than a topmost surface of the body contact region, and a bottommost surface of the source region is lower than a bottommost surface of the body contact region, and
   wherein a top of the trench and a top of another trench immediately adjacent to the trench are coplanar with each other.

2. The power semiconductor device of claim 1, further comprising:
   a field stop region formed below the drift region; and
   a collector region formed below the field stop region,
   wherein a maximum doping concentration of the collector region is higher than that of the field stop region.

3. The power semiconductor device of claim 1, wherein the source region has a maximum vertical depth in a vertical direction from the topmost surface of the source region and a maximum horizontal length in a horizontal direction along a top surface of the substrate, and
   wherein the maximum vertical depth is greater than the maximum horizontal length.

4. The power semiconductor device of claim 1, wherein the source region is partially disposed on a top surface of the body contact region.

5. The power semiconductor device of claim 2, wherein the field stop region has a thickness in a range of 5 to 25 µm.

6. The power semiconductor device of claim 2, further comprising a collector electrode directly contacting the collector region.

7. A power semiconductor device, comprising:
   a trench formed in a substrate;
   a gate insulating layer and a gate electrode formed in the trench having a preset depth from a surface of the substrate;
   a source region of a first conductivity type formed adjacent to an upper portion of the trench;
   a body region of a second conductivity type formed adjacent to the trench;
   a body contact region of the second conductivity type formed in the body region; and
   an interlayer insulating layer formed on the gate electrode, wherein a bottommost surface of the interlayer insulating layer on the gate electrode is lower than a topmost surface of the source region;
   an emitter electrode formed on the interlayer insulating layer and in direct contact with the body contact region and the source region,
   wherein an interface between the emitter electrode and the source region is not coplanar with an interface between the emitter electrode and the body contact region,
   wherein a top of the trench and a top of another trench immediately adjacent to the trench are coplanar with each other, and
   wherein the bottommost surface of the interlayer insulating layer on the gate electrode and an upper surface of the gate electrode formed in the trench have a concave shape.

8. The power semiconductor device of claim 7, further comprising:
   a drift region formed below the body region;

a field stop region formed below the drift region;
a collector region formed below the field stop region; and
a collector electrode directly in contact with the collector region.

9. The power semiconductor device of claim 7, wherein the source region is partially disposed over the body contact region.

10. The power semiconductor device of claim 7, wherein a bottom portion of the source region has a width in a horizontal direction narrower than an upper portion of the source region.

11. A power semiconductor device, comprising:
a first trench and a second trench immediately adjacent to the first trench, both trenches being formed in a substrate and a top of the first trench and a top of the second trench being coplanar with each other;
a first gate insulating layer and a second gate insulating layer respectively formed along a surface of each trench;
a first gate electrode on the first gate insulating layer and a second gate electrode on the second gate insulating layer;
a body region formed between the first trench and the second trench;
a first source region formed adjacent to an upper portion of the first trench;
a second source region formed adjacent to an upper portion of the second trench;
a body contact region formed between the first source region and the second source region;
a first interlayer insulating layer on the first gate electrode; and
an emitter electrode formed on the body contact region,
wherein a bottommost surface of the first interlayer insulating layer on the first gate electrode has a concave shape, and is lower than a topmost surface of the first source region, and
wherein an interface between the emitter electrode and the source region is not coplanar with an interface between the emitter electrode and the body contact region.

12. The power semiconductor device of claim 11, further comprising:
a drift region of a first conductivity type formed below the body region;
a field stop region of the first conductivity type formed below the drift region; and
a collector region of a second conductivity type formed below the field stop region.

13. The power semiconductor device of claim 11, wherein the topmost surface of the first source region contacting the emitter electrode is higher than a topmost surface of the body contact region, and a bottommost surface of the first source region is lower than a bottommost surface of the body contact region.

14. The power semiconductor device of claim 11, wherein an upper surface of the first gate electrode and the second gate electrode formed in the first trench and the second trench has a concave shape.

* * * * *